US009128313B2

(12) United States Patent
Shim et al.

(10) Patent No.: US 9,128,313 B2
(45) Date of Patent: Sep. 8, 2015

(54) METHOD OF MANUFACTURING LIQUID CRYSTAL DISPLAY

(71) Applicant: SAMSUNG DISPLAY CO., LTD., Yongin, Gyeonggi-Do (KR)

(72) Inventors: Seung Bo Shim, Asan-si (KR); Jun Gi Kim, Seoul (KR); Yang-Ho Jung, Seoul (KR); Jin Ho Ju, Seoul (KR); Jun Hong Park, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/104,032

(22) Filed: Dec. 12, 2013

(65) Prior Publication Data

US 2015/0024583 A1    Jan. 22, 2015

(30) Foreign Application Priority Data

Jul. 18, 2013   (KR) .................. 10-2013-0084948

(51) Int. Cl.
*H01L 21/3205* (2006.01)
*G02F 1/1333* (2006.01)
*H01L 27/12* (2006.01)

(52) U.S. Cl.
CPC .......... *G02F 1/1333* (2013.01); *H01L 27/1296* (2013.01)

(58) Field of Classification Search
CPC .......................... H01L 27/1296; G02F 1/1333
USPC ....................................................... 438/586
See application file for complete search history.

(56) References Cited

U.S. PATENT DOCUMENTS

| 6,781,651 | B2* | 8/2004 | Song et al. .................. 349/111 |
| 7,106,403 | B2  | 9/2006 | Murai et al. |
| 7,553,707 | B2* | 6/2009 | Horino et al. ................. 438/149 |
| 7,570,326 | B2* | 8/2009 | Matsuno ....................... 349/114 |
| 7,675,062 | B2* | 3/2010 | Hong et al. ...................... 257/59 |
| 2007/0273803 | A1* | 11/2007 | Liou et al. ....................... 349/43 |

FOREIGN PATENT DOCUMENTS

| JP | 05-206462 | 8/1993 |
| JP | 2002-341355 | 11/2002 |
| JP | 2004-317889 | 11/2004 |
| KR | 1994-0003057 | 2/1994 |
| KR | 1020050069533 | 7/2005 |
| KR | 1020060033630 | 4/2006 |
| KR | 1020060044256 | 5/2006 |
| KR | 1020080023904 | 3/2008 |
| KR | 1020080026758 | 3/2008 |
| KR | 1020100031049 | 3/2010 |
| KR | 1020110055274 | 5/2011 |

* cited by examiner

*Primary Examiner* — Reema Patel
*Assistant Examiner* — Syed Gheyas
(74) *Attorney, Agent, or Firm* — F.Chau & Associates, LLC

(57) ABSTRACT

A method of manufacturing a liquid crystal display includes disposing a gate electrode and a light blocking member on a substrate, disposing a source electrode and a drain electrode on the gate electrode to form a thin film transistor, disposing a data line on the light blocking member, disposing an organic layer on the thin film transistor and the data line, exposing a first convex part of the organic layer to light in a first area corresponding to the thin film transistor during an exposure process, and exposing a second convex part of the organic layer to the light in a second area corresponding to the data line during the exposure process using a mask. The mask includes a first transflective part aligned with the first area and a second transflective part aligned with the second area during the exposure process.

20 Claims, 6 Drawing Sheets

METHOD OF MANUFACTURING LIQUID CRYSTAL DISPLAY

CROSS-REFERENCE TO RELATED APPLICATIONS

This application claims priority under 35 U.S.C. §119 to Korean Patent Application No. 10-2013-0084948 filed on Jul. 18, 2013, the disclosure of which is incorporated by reference herein in its entirety.

TECHNICAL FIELD

Exemplary embodiments of the present invention relate to a method of manufacturing a liquid crystal display, and more particularly, to a method of manufacturing a liquid crystal display in which a step between a light blocking area and a transmission area is reduced or eliminated.

Discussion of the Related Art

A liquid crystal display includes two display panels on which electric field generating electrodes such as a pixel electrode and a common electrode are formed, and a liquid crystal layer disposed between the two display panels. The liquid crystal display displays an image by applying a voltage to the electric field generating electrodes to generate an electric field in the liquid crystal layer, changing the orientation of liquid crystal molecules of the liquid crystal layer through the generated electric field, and controlling polarization of incident light.

During the manufacturing of a liquid crystal display, an unnecessary step may be generated between a light blocking area in which a light blocking member is formed and a transmission area in which the light blocking member is not formed. Due to the step between the light blocking area and the transmission area, spreadability of the liquid crystals of the liquid crystal layer may deteriorate during a process of injecting the liquid crystal layer between the two display panels, and as a result, mura due to non-uniformity of the liquid crystal layer may be generated.

SUMMARY

Exemplary embodiments of the present invention provide a method of manufacturing a liquid crystal display which can improve display defects such as, for example, mura that may occur due to non-uniformity of a liquid crystal layer caused by steps formed within the liquid crystal display.

According to an exemplary embodiment of the present invention, a method of manufacturing a liquid crystal display includes disposing a gate electrode and a light blocking member on an insulation substrate, disposing a source electrode and a drain electrode on the gate electrode to form a thin film transistor, disposing a data line on the light blocking member, disposing an organic layer on the thin film transistor and the data line, and exposing a convex part of the organic layer to light in areas of the thin film transistor and the data line using a mask including a transflective part formed on the areas of the thin film transistor and the data line.

The mask may include a transmission part for forming a contact hole where a pixel electrode connected to the drain electrode included in the thin film transistor is formed.

An exposure amount through the transflective part relative to an exposure amount through the transmission part may be about 2.5%.

An exposure amount through the transflective part formed on the area of the data line and an exposure amount through the transflective part formed on the area of the thin film transistor may be different from each other.

The exposure amount through the transflective part formed on the area of the data line may be larger than the exposure amount through the transflective part formed on the area of the thin film transistor.

The exposure amount through the transflective part formed on the area of the thin film transistor may be about 0.

The exposure amount through the transflective part formed on the area of the thin film transistor may be larger than the exposure amount through the transflective part formed on the area of the data line.

The exposure amount through the transflective part formed on the area of the data line may be about 0.

An intensity contrast of light penetrating the transflective part may be smaller than or equal to about 0.1.

The method may further include performing planarization by removing the convex part of the organic layer using a developing solution.

The organic layer may be an interlayer insulating layer for suppressing contamination of a liquid crystal layer between a lower display panel including the insulation substrate and an upper display panel facing the lower display panel.

The organic layer may be a color filter for displaying one of primary colors such as red, green, and blue.

According to an exemplary embodiment of the present invention, a method of manufacturing a liquid crystal display includes disposing a gate electrode and a light blocking member on a substrate, disposing a source electrode and a drain electrode on the gate electrode to form a thin film transistor, disposing a data line on the light blocking member, disposing an organic layer on the thin film transistor and the data line, exposing a first convex part of the organic layer to light in a first area corresponding to the thin film transistor during an exposure process, and exposing a second convex part of the organic layer to the light in a second area corresponding to the data line during the exposure process using a mask. The mask includes a first transflective part aligned with the first area corresponding to the thin film transistor and a second transflective part aligned with the second area corresponding to the data line during the exposure process.

According to an exemplary embodiment of the present invention, a method of manufacturing a liquid crystal display includes disposing a light blocking member on a substrate, disposing a data line on the light blocking member, disposing an organic layer on the data line, and exposing a convex part of the organic layer to light in a first area corresponding to the data line during an exposure process using a mask. The mask includes a transflective part aligned with the first area corresponding to the data line during the exposure process.

According to an exemplary embodiment of the present invention, a method of manufacturing a liquid crystal display includes disposing a gate electrode on a substrate, disposing a source electrode and a drain electrode on the gate electrode to form a thin film transistor, disposing an organic layer on the thin film transistor, and exposing a convex part of the organic layer to light in a first area corresponding to the thin film transistor during an exposure process using the mask. The mask includes a transflective part aligned with the first area corresponding to the thin film transistor during the exposure process.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
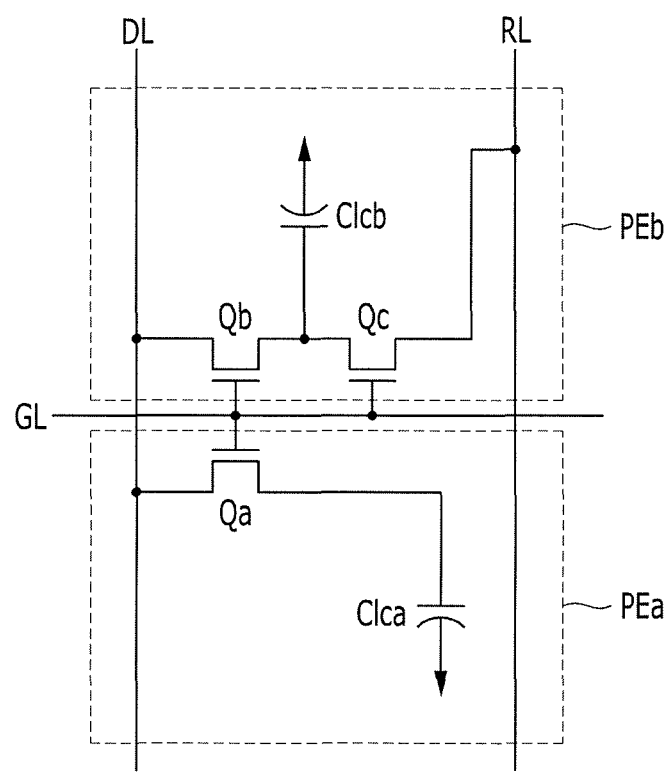
FIG. 1 is an equivalent circuit diagram of one pixel of a liquid crystal display, according to an exemplary embodiment of the present invention.

Exemplary embodiments of the present invention will be described more fully hereinafter with reference to the accompanying drawings. Like reference numerals may refer to like elements throughout the accompanying drawings.

In the drawings, the thickness of layers, films, panels, regions, etc., may be exaggerated for clarity. It will be understood that when an element or layer is referred to as being "on" another element or layer, it can be directly on the other element or layer or intervening elements or layers may also be present. Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

A signal line, an arrangement of pixels, and a method of driving a liquid crystal display according to an exemplary embodiment of the present invention will be described with reference to FIG. 1.

FIG. 1 is an equivalent circuit diagram of one pixel of a liquid crystal display, according to an exemplary embodiment of the present invention.

Referring to FIG. 1, one pixel of the liquid crystal display according to an exemplary embodiment includes a gate line GL transmitting a gate signal, a data line DL transmitting a data signal, a plurality of signal lines including a divided voltage reference voltage line RL transmitting a divided voltage reference voltage, first, second, and third switching elements Qa, Qb, and Qc connected to the plurality of signal lines and the data line DL, and first and second liquid crystal capacitors Clca and Clcb.

The first and second switching elements Qa and Qb are connected to the gate line GL and the data line DL, respectively, and the third switching element Qc is connected to an output terminal of the second switching element Qb and the divided voltage reference voltage line RL.

The first to third switching elements Qa to Qc may each be a three terminal element such as, for example, a thin film transistor (TFT).

Referring to the first and second switching elements Qa and Qb, a control terminal is connected to the gate line GL, an input terminal is connected to the data line DL, an output terminal of the first switching element Qa is connected to the first liquid crystal capacitor Clca, and an output terminal of the second switching element Qb is connected to the second liquid crystal capacitor Clcb and an input terminal of the third switching element Qc.

Referring to the third switching element Qc, a control terminal is connected to the gate line GL, an input terminal is connected to the second liquid crystal capacitor Clcb, and an output terminal is connected to the divided voltage reference voltage line RL.

When a gate-on signal is applied to the gate line GL, the first switching element Qa, the second switching element Qb, and the third switching element Qc connected to the gate line GL are turned on. Accordingly, data voltages applied to the data line DL are applied to a first sub-pixel electrode PEa and a second sub-pixel electrode PEb through the turned-on first switching element Qa and second switching element Qb. At this time, the data voltages applied to the first sub-pixel electrode PEa and the second sub-pixel electrode PEb are the same, and the first liquid crystal capacitor Clca and the second liquid crystal capacitor Clcb are charged with the same value corresponding to a difference between a common voltage and the data voltage. At the same time, the voltage charged in the second liquid crystal capacitor Clcb is divided through the turned-on third switching element Qc. Accordingly, a voltage value charged in the second liquid crystal capacitor Clcb is lowered by a difference between a common voltage and a divided voltage reference voltage. That is, the voltage charged in the first liquid crystal capacitor Clca is higher than the voltage charged in the second liquid crystal capacitor Clcb.

As described above, the voltage charged in the first liquid crystal capacitor Clca and the voltage charged in the second liquid crystal capacitor Clcb may become different from each other. When the voltage of the first liquid crystal capacitor Clca and the voltage of the second liquid crystal capacitor Clcb are different from each other, inclined angles of liquid crystal molecules in the first sub-pixel electrode PEa and the second sub-pixel electrode PEb become different. As a result, the luminance of the two sub-pixels Pea and PEb becomes different. According to exemplary embodiments, the voltage of the first liquid crystal capacitor Clca and the voltage of the second liquid crystal capacitor Clcb may be controlled such that the viewing angle of the liquid crystal display may be improved.

In the exemplary embodiment shown in FIG. 1, although the third switching element Qc connected to the second liquid crystal capacitor Clcb and the divided voltage reference voltage line RL is included, which allows for the voltage charged in the first liquid crystal capacitor Clca and the voltage charged in the second liquid crystal capacitor Clcb to be different from each other, in an exemplary embodiment, the second liquid crystal capacitor Clcb may be connected to a step-down capacitor. For example, the voltage charged in the first liquid crystal capacitor Clca and the voltage charged in the second liquid crystal capacitor Clcb may be differently set by including the third switching element Qc including a first terminal connected to a step-down gate line, a second terminal connected to the second liquid crystal capacitor Clcb, and a third terminal connected to the step-down capacitor, and charging the second liquid crystal capacitor Clcb may utilize the step-down capacitor. Further, in a liquid crystal display according to an exemplary embodiment, the voltage charged in the first liquid crystal capacitor Clca and the voltage charged in the second liquid crystal capacitor Clcb may be differently set by connecting the first liquid crystal capacitor Clca and the second liquid crystal capacitor Clcb to different data lines to receive different data voltages. In addition, in exemplary embodiments, the voltage charged in the first liquid crystal capacitor Clca and the voltage charged in the second liquid crystal capacitor Clcb may be differently set through other various methods.

Figure 2:
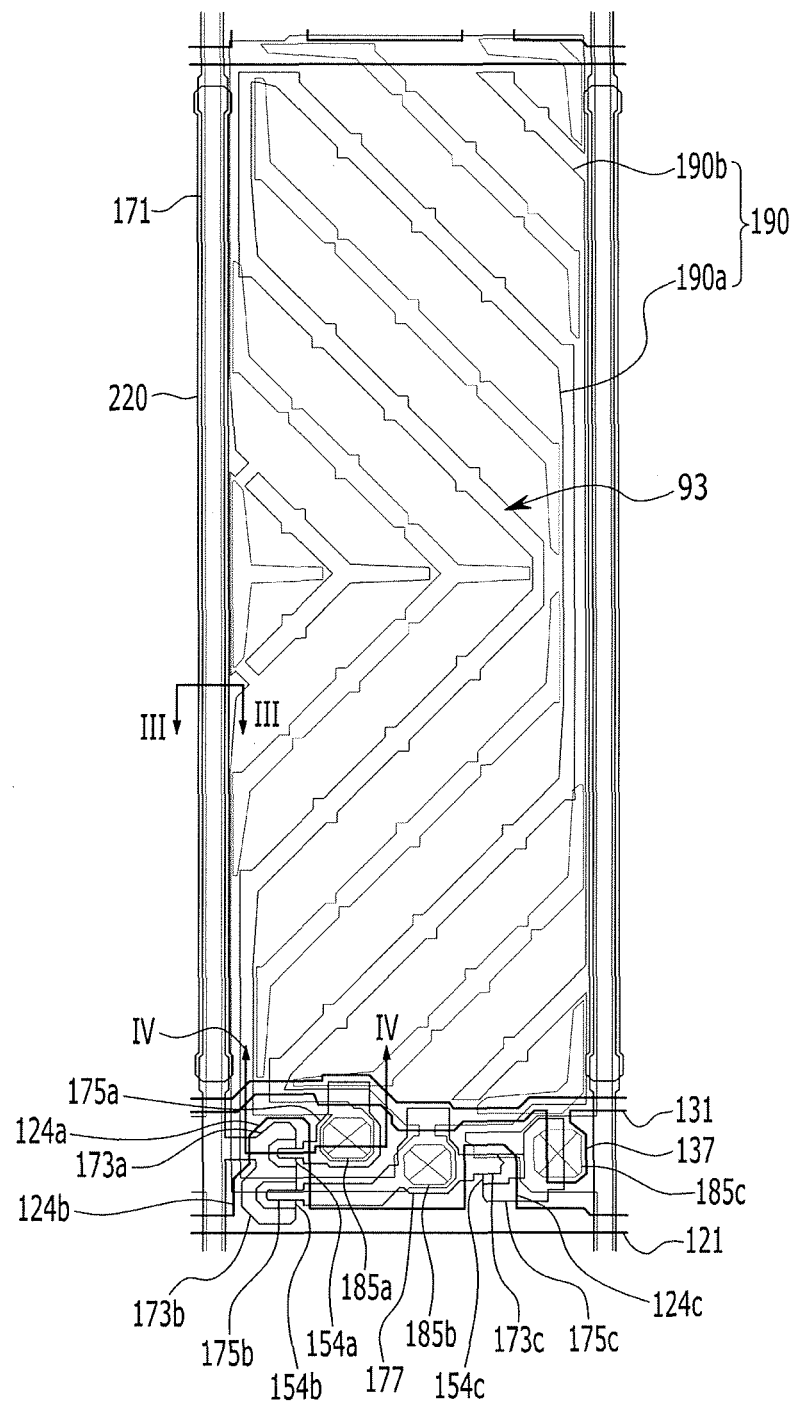
FIG. 2 is a layout view of one pixel of a liquid crystal display, according to an exemplary embodiment of the present invention.
Figure 3:
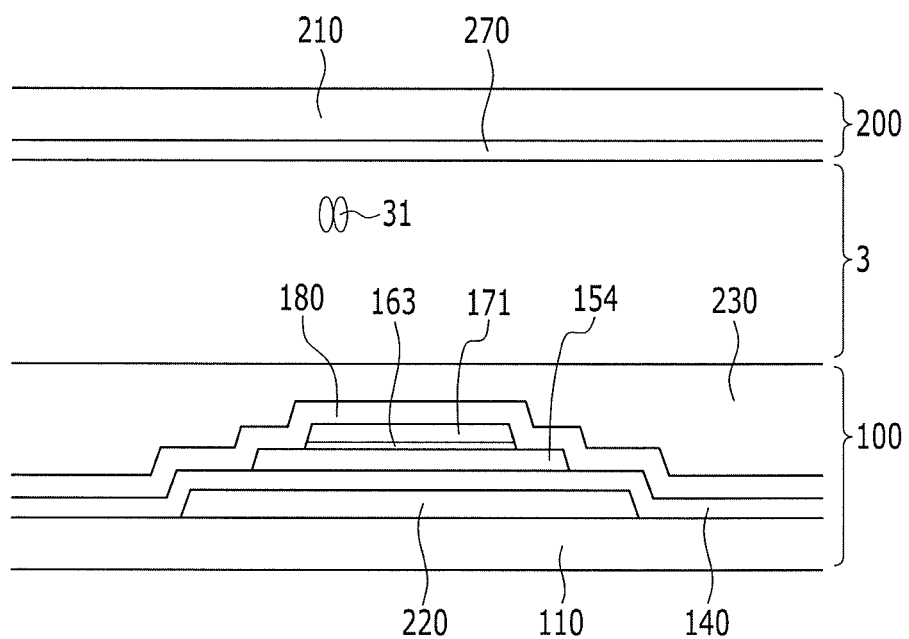
FIG. 3 is a cross-sectional view taken along line of the liquid crystal display of FIG. 1, according to an exemplary embodiment of the present invention.
Figure 4:
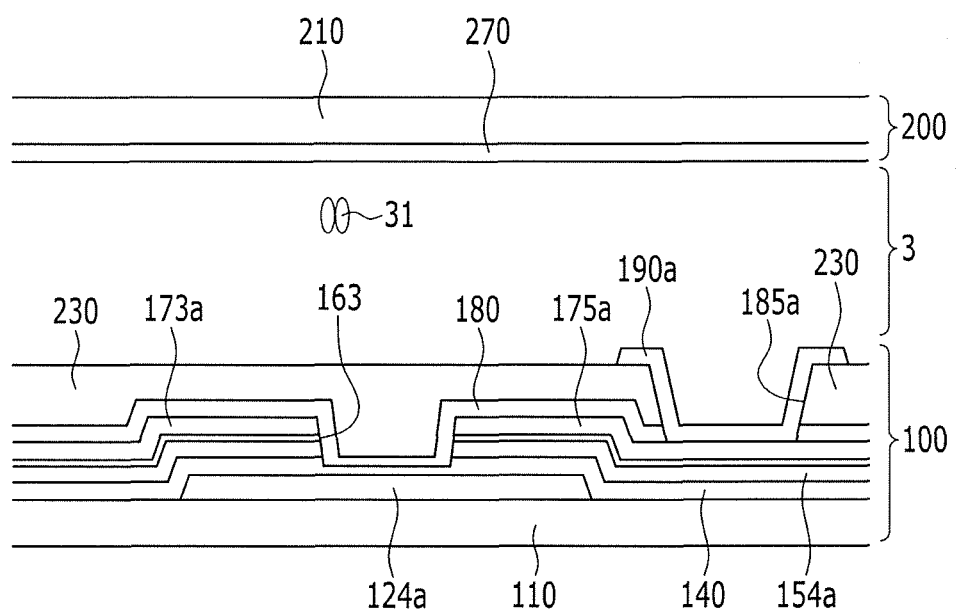
FIG. 4 is a cross-sectional view taken along line IV-IV of the liquid crystal display of FIG. 1, according to an exemplary embodiment of the present invention.

A structure of the liquid crystal display according to the exemplary embodiment illustrated in FIG. 1 will be briefly described with reference to FIGS. 2 to 4. FIG. 2 is a layout view of one pixel of a liquid crystal display, according to an exemplary embodiment of the present invention. FIG. 3 is a cross-sectional view taken along line of the liquid crystal display of FIG. 2, according to an exemplary embodiment of the present invention. FIG. 4 is a cross-sectional view taken along line IV-IV of the liquid crystal display of FIG. 2, according to an exemplary embodiment of the present invention.

Referring to FIGS. 2 to 4, the liquid crystal display according to an exemplary embodiment includes a lower display panel 100 and an upper display panel 200 which face each other, a liquid crystal layer 3 disposed between the two display panels 100 and 200, and a pair of polarizers attached to outer surfaces of the displays panels 100 and 200.

Hereinafter, the lower display panel 100 will be described in further detail.

A gate conductor including a gate line 121 and a divided voltage reference voltage line 131 is formed on an insulation substrate 110. The insulation substrate 110 may be formed of for example, a transparent glass or plastic. Further, a light blocking member 220 is formed on the insulation substrate 110.

The light blocking member 220 extends along a data line 171. The light blocking member 220 may be formed of the same material as that of the gate conductor during a process of forming the gate conductor. A width of the light blocking member 220 may be wider than a width of the data line 171. In exemplary embodiments, by forming the light blocking member 220 to have a wider width than that of the data line 171, the generation of noise may be prevented or reduced in a data signal flowing in the data line as the result of light from a backlight.

The gate line 121 includes a first gate electrode 124a, a second gate electrode 124b, a third gate electrode 124c, and a wide end part for a connection with another layer or an external driving circuit.

The divided voltage reference voltage line 131 includes a reference electrode 137.

A gate insulating layer 140 is formed on the gate line 121 and the divided voltage reference voltage line 131.

A semiconductor 154 is formed on the gate insulating layer 140. The semiconductor 154 includes a first semiconductor 154a forming a channel of a first thin film transistor (e.g., the first switching element Qa), a second semiconductor 154b forming a channel of a second thin film transistor (e.g., the second switching element Qb), and a third semiconductor 154c forming a channel of a third thin film transistor (e.g., the third switching element Qc).

An ohmic contact 163 is formed on the semiconductor 154.

A plurality of data lines 171 and a data conductor are formed on the ohmic contact 163. The plurality of data lines 171 includes a first source electrode 173a and a second source electrode 173b. The data conductor includes a first drain electrode 175a, a second drain electrode 175b, a third source electrode 173c, and a third drain electrode 175c.

The data conductor, and the semiconductor 154 and the ohmic contact 163, which are located below the data conductor, may be simultaneously formed using one mask.

The data line 171 may include a wide end part for a connection with another layer or an external driving circuit.

The first gate electrode 124a, the first source electrode 173a, and the first drain electrode 175a form one first thin film transistor Qa together with the first semiconductor 154a, and a channel of the thin film transistor is formed on the first semiconductor 154a between the first source electrode 173a and the first drain electrode 175a. Similarly, the second gate electrode 124b, the second source electrode 173b, and the second drain electrode 175b form one second thin film transistor Qb together with the second semiconductor 154b, and a channel is formed on the second semiconductor 154b between the second source electrode 173b and the second drain electrode 175b. The third gate electrode 124c, the third source electrode 173c, and the third drain electrode 175c form one third thin film transistor Qc together with the third semiconductor 154c, and a channel is formed on the third semiconductor 154c between the third source electrode 173c and the third drain electrode 175c.

The second drain electrode 175b is connected with the third source electrode 173c and includes an extension part 177, which may widely expand, as shown in FIG. 2.

A passivation layer 180 is formed on the data line 171, the data conductor, and the exposed semiconductors 154a, 154b, and 154c. The passivation layer 180 may include an inorganic insulating layer such as, for example, silicon nitride or silicon oxide, however the passivation layer 180 is not limited thereto.

An organic layer 230 is formed on the passivation layer 180. The organic layer 230 covers the thin film transistors Qa, Qb, and Qc and the data line 171, and vertically extends along two adjacent data lines 171. The organic layer 230 may be, for example, an interlayer insulating layer used to suppress contamination of the liquid crystal layer 3. Alternatively, the organic layer 230 may be, for example, a color filter for displaying colors. However, the organic layer 230 is not limited thereto.

A first contact hole 185a and a second contact hole 185b, which expose the first drain electrode 175a and the second drain electrode 175b, are formed on the passivation layer 180 and the organic layer 230.

A plurality of pixel electrodes 190, each including first and second sub-pixel electrodes 190a and 190b, are formed on the organic layer 230. The pixel electrode 190 may be formed of, for example, a transparent material such as indium tin oxide (ITO) or indium zinc oxide (IZO). In exemplary embodiments, the pixel electrode 190 may be formed on a transparent conductive material such as, for example, ITO or IZO, or a reflective metal such as, for example, aluminum, silver, chromium, or an alloy thereof.

The first and second sub-pixel electrodes 190a and 190b are physically and electrically connected with the drain electrodes 175a and 175b through the contact holes 185a and 185b, and receive data voltages from the drain electrodes 175a and 175b, respectively. Part of the data voltage applied to the second drain electrode 175b may be divided through the third source electrode 173c. As a result, the voltage applied to the first sub-pixel electrode 190a may become larger than the voltage applied to the second sub-pixel electrode 190b.

The first sub-pixel electrode 190a and the second sub-pixel electrode 190b receiving the data voltages generate an electric field together with a common electrode 270 of the upper display panel 200, which determines a direction of liquid crystal molecules of the liquid crystal layer 3 between the pixel electrode 190 and the common electrode 270. Luminance of the light penetrating the liquid crystal layer 3 is changed according to the direction of the liquid crystal molecules.

Different data voltages, which may be preset for one input image signal, are applied to the pair of sub-pixel electrodes 190a and 190b, and the data voltages may be set differently according to the respective size and shape of the sub-pixel electrodes 190a and 190b. Areas of the sub-pixel electrodes 190a and 190b may be the same as each other or different from each other.

The sub-pixel electrodes 190a and 190b receiving the data voltages generate an electric field together with the common electrode 270, which determines an arrangement of the liquid crystal molecules of the liquid crystal layer 3 between the pixel electrode 190 and the common electrode 270 (e.g., between the first sub-pixel 190a and the common electrode 270 and between the second sub-pixel 190b and the common electrode 270).

Each pixel electrode 190 may be chamfered at a corner (e.g., at a right corner). A chamfered oblique side may form an angle of about 45 degrees with respect to the gate line 121.

One pair of first and second sub-pixel electrodes 190a and 190b forming one pixel electrode 190 are interlocked with a gap 93 therebetween, and an outer boundary thereof may have an approximately quadrangular shape.

Hereinafter, the upper display panel 200 will be described in further detail.

The common electrode 270 is formed on an insulation substrate 210. An upper alignment layer is formed on the common electrode 270. The upper alignment layer may be, for example, a vertical alignment layer.

The liquid crystal layer 3 may have negative dielectric anisotropy, and the liquid crystal molecules 31 of the liquid crystal layer 3 may be aligned such that a long axis thereof forms a right angle, or substantially a right angle, with respect to surfaces of the two display panels 100 and 200 in a state in which there is no electric field.

Hereinafter according to an exemplary embodiment of the present invention, a method of removing a step between a light blocking area in which a light blocking member is formed and a transmission area in which the light blocking member is not formed during a process of manufacturing the lower display panel 100 will be described with reference to FIGS. 5 and 6.

Figure 5:
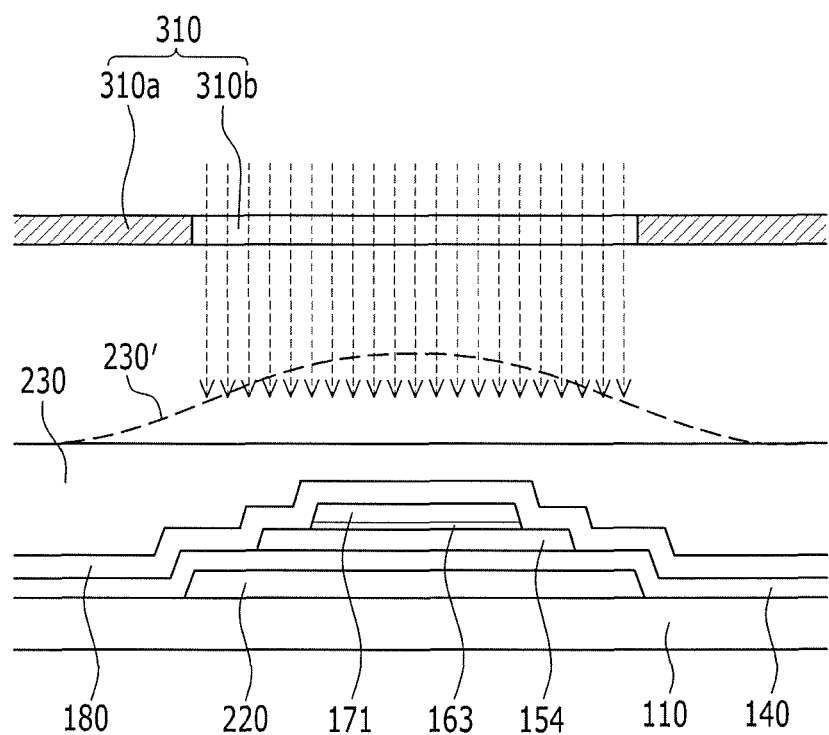
FIG. 5 is a cross-sectional view illustrating a method of manufacturing a liquid crystal display in which a step is removed from between a light blocking area and a transmission area of a data line in a liquid crystal display, according to an exemplary embodiment of the present invention.

FIG. 5 is a cross-sectional view illustrating a method of manufacturing a liquid crystal display in which a step is removed from between a light blocking area and a transmission area of a data line in a liquid crystal display, according to an exemplary embodiment of the present invention. FIG. 6 is a cross-sectional view illustrating a method of manufacturing a liquid crystal display in which a step is removed from between a light blocking area and a transmission area of a thin film transistor in a liquid crystal display, according to an exemplary embodiment of the present invention.

For convenience of explanation, a detailed description of the method of manufacturing the data line 171 and the first thin film transistor Qa during the manufacturing of the lower display panel 100 will be omitted. Further, although the following description is made with reference to the first thin film transistor Qa, the following description is also applicable to the second and third thin film transistors Qb and Qc.

The gate conductor including the gate line 121, and the divided voltage reference voltage line 131 and the light blocking member 220, are formed on the insulation substrate 110. The gate line 121 includes the first gate electrode 124a. The gate conductor and the light blocking member 220 may be formed of a metal material such as, for example, silver (Ag), gold (Au), platinum (Pt), copper (Cu), molybdenum (Mo), or aluminum (Al), or a combination thereof. However, the gate conductor and the light blocking member 220 are not limited thereto.

The gate insulating layer 140 is formed on the gate conductor and the light blocking member 220. The gate insulating layer 140 may be formed of an inorganic insulating material such as, for example, silicon nitride (SiNx) or silicon oxide (SiOx). However, the gate insulating layer 140 is not limited thereto.

The semiconductor 154 is formed on the gate insulating layer 140. The semiconductor 154 formed on the light blocking member 220 is formed to have a narrower width than that of the light blocking member 220. That is, the width of the semiconductor 154 formed on the light blocking member 220 is smaller than the width of the light blocking member 220.

The ohmic contact 163 is formed on the semiconductor 154.

The data line 171 and the data conductor are formed on the ohmic contact 163. The data line 171 includes the first source electrode 173a. The data conductor includes the first drain electrode 175a.

The data line 171 formed on the light blocking member 220 may be formed to have a narrower width than that of the light blocking member 220. That is, the width of the data line 171 formed on the light blocking member 220 may be smaller than the width of the light blocking member 220. The first source electrode 173a and the first drain electrode 175a may be formed, for example, using a predetermined pattern through a photolithography method.

The passivation layer 180 is formed on the data line 171, the data conductor, and the exposed semiconductor 154. The passivation layer 180 may be formed of an inorganic insulating material such as, for example, silicon nitride (SiNx) or silicon oxide (SiOx). However, the passivation layer 180 is not limited thereto.

As described above, the first thin film transistor Qa may be formed by forming the first gate electrode 124a and the light blocking member 220 on the insulation substrate 110, and by forming the first source electrode 173a and the first drain electrode 175a on the first gate electrode 124a. Further, the data line 171 may be formed on the light blocking member 220.

Subsequently, the organic layer 230 is formed on a front surface (e.g., an upper surface) of the lower display panel 100 including the first thin film transistor Qa and the data line 171. That is, the organic layer 230 is formed on the first thin film transistor Qa and the data line 171.

Hereinafter, for convenience of explanation, an organic layer 230' formed before an exposure and development process using a mask 310 may be referred to as a first organic layer 230', and the organic layer 230 formed after the exposure and development process using the mask 310 may be referred to as a second organic layer 230.

The first organic layer 230' may be coated using, for example, a spin court method. The first organic layer 230' may be formed in a convex shape in the light blocking area (e.g., the area in which the light blocking member 220 is formed). Further, the first organic layer 230' may be formed in a convex shape in an area corresponding to the first thin film transistor Qa. The convex shape may be formed as a result of the presence of a step between the light blocking area in which the light blocking member 220 is formed and the transmission area in which the light blocking member 220 is not formed, as well as because of a step generated by a thickness of the first gate electrode 124a.

According to an exemplary embodiment, the exposure process is performed after the first organic layer 230' is formed. The exposure process is performed using the mask 310, which in an exemplary embodiment, includes a light blocking part 310a, a transflective part 310b, and a transmission part 310c. The mask 310 may be, for example, a halftone photomask or a slit mask, however the mask 310 is not limited thereto.

Figure 6:
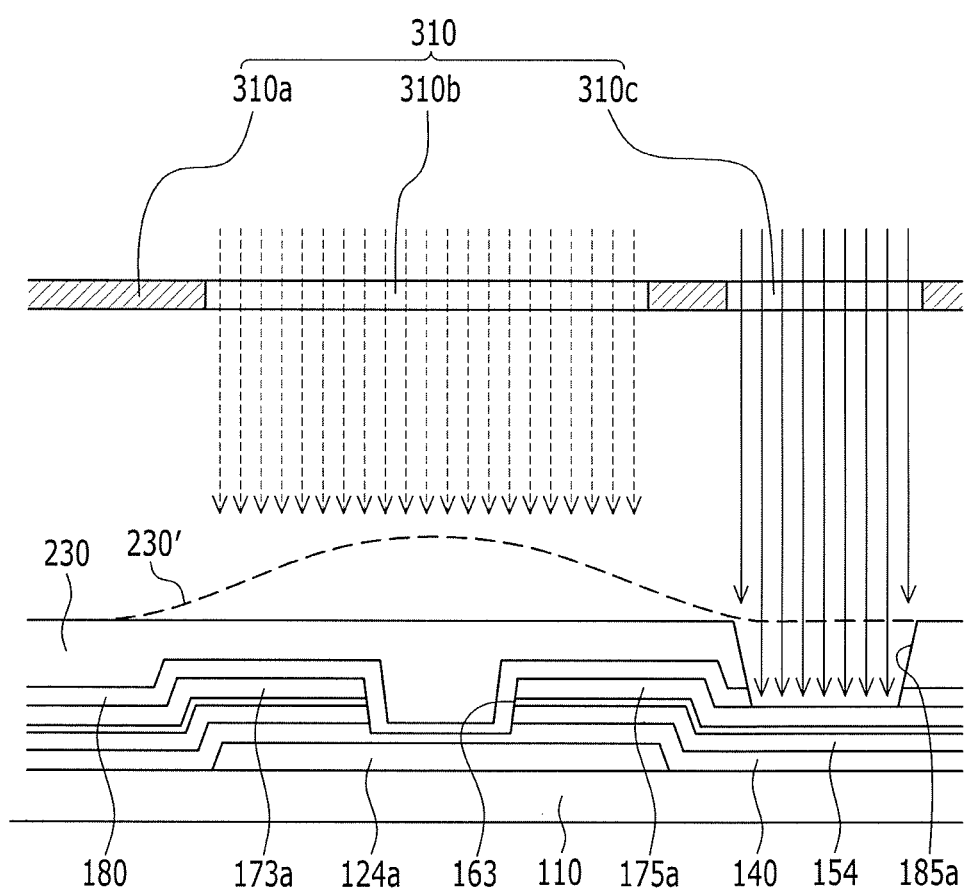
FIG. 6 is a cross-sectional view illustrating a method of manufacturing a liquid crystal display in which a step is removed from between a light blocking area and a transmission area of a thin film transistor in a liquid crystal display, according to an exemplary embodiment of the present invention.

The transflective part 310b may be formed in an area corresponding to the data line 171 in which the light blocking member 220 is formed (see, e.g., FIG. 5), and in an area corresponding to the first thin film transistor Qa in which the first gate electrode 124a is formed (see, e.g., FIG. 6). The transmission part 310c is formed in an area corresponding to where the first contact hole 185a will be formed. The light blocking part 310a is formed in an area other than areas in which the data line 171, the thin film transistors Qa, Qb, and Qc, and the contact holes 185a, 185b, and 185c are formed or will be formed. Herein, the mask 310 may be described as including a first transflective part 310b that aligns with the area corresponding to the data line 171 in which the light blocking member 220 is formed, and a second transflective part 310b that aligns with the area corresponding to the first thin film transistor Qa in which the first gate electrode 124a is formed. That is, the transflective part 310b of the mask may be referred to as including a first transflective part 310b and a second transflective part 310b.

When the exposure process using the mask 310 is performed, a convex part of the first organic layer 230' is exposed to the light penetrating the transflective part 310b, and the first organic layer 230' in an area corresponding to the first contact hole 185a is exposed to the light penetrating the transmission part 310c. The amount of exposure occurring through the transflective part 310b of the mask 310 and the transmission part 310c of the mask are different from each other. For example, since the transflective part 310b of the mask 310 both transmits and reflects light, the exposure amount through the transflective part 310b is less than the exposure amount through the transmission part 310c. For example, relative to the exposure amount through the transmission part 310c, the exposure amount through the transflective part 310b may be about 2.5%, which may be the same, or substantially the same, in the area corresponding to the data line 171 and the area corresponding to the first thin film transistor Qa. That is, the exposure amount through the transflective part 310b may be about 2.5% of the exposure amount through the transmission part 310c. Further, in exemplary embodiments, the exposure amount through the transflective part 310b in the areas corresponding to the data line 171 and the first thin film transistor Qa may be different from each other, as described in further detail below. The exposure amount refers to the amount of light passing through the mask 310 that reaches a corresponding portion of the liquid crystal display.

When the development process is performed using a developing solution after the exposure process, the convex part of the first organic layer 230' and the first organic layer 230' in the area corresponding to the first contact hole 185a are removed. Accordingly, the second organic layer 230, which is planarized from the convex parts of the first organic layer 230' corresponding to the area of the data line 171 (e.g., the first convex part) and the area corresponding to the first thin film transistor Qa (e.g., the second convex part), may be formed. The first contact hole 185a is formed in an area corresponding to the transmission part 310c.

A first step between the light blocking area and the transmission area of the data line 171, and a second step between the light blocking area and the transmission area of the first thin film transistor Qa may be different from each other. Accordingly, in exemplary embodiments, the exposure amount through the transflective part 310b of the mask 310 corresponding to the area of the data line 171 and the exposure amount through the transflective part 310b of the mask 310 corresponding to the area of the first thin film transistor Qa may be differently controlled.

For example, thicknesses of the light blocking member 220 and the first gate electrode 124a may be about 5300 Å. The step in the area of the first thin film transistor Qa may be about 5300 Å, corresponding to the thickness of the first gate electrode 124a. In contrast, the step in the area of the data line 171 may be about 13,600 Å, corresponding to a sum of thicknesses of the light blocking member 220, the semiconductor 154, the ohmic contact 163, and the data line 171.

As the step becomes larger, the convex part of the first organic layer 230' also becomes larger. That is, as the step becomes larger, the protrusion of the convex part of the first organic layer 230' increases.

Accordingly, in an exemplary embodiment, the exposure amount through the transflective part 310b of the mask 310 corresponding to the area of the data line 171 may be controlled to be larger than the exposure amount through the transflective part 310b of the mask 310 corresponding to the area of the first thin film transistor Qa.

For example, when the exposure amount through the transmission part 310c of the mask 310 is A, the exposure amount through the transflective part 310b of the mask 310 corresponding to the area of the data line 171 is B, and the exposure amount through the transflective part 310b of the mask 310 corresponding to the area of the first thin film transistor Qa is C, such that the exposure amounts have the relationship A>B>C.

The exposure amount and exposure time may be determined based on the type (e.g., the material) of the first organic layer 230' and the size of the convex part of the first organic layer 230'. For example, in an exemplary embodiment, when the exposure amount of A is about 100%, the exposure amount of B may be from about 2.5% to about 5%, and the exposure amount of C may be from about 2% to about 3%.

In an exemplary embodiment, a spacer that maintains an interval between the lower display panel 100 and the upper display panel 200 may be formed in an area corresponding to the first thin film transistor Qa. When the spacer is included, the convex part of the first organic layer 230' in the area corresponding to the first thin film transistor Qa may be left (e.g., little removal may occur). In this case, the exposure amounts satisfy A>B>C, and C may be nearly 0.

When the convex part of the first organic layer 230' is left in the area corresponding to the data line 171 and the convex part of the first organic layer 230' is removed in the area corresponding to the first thin film transistor Qa, the exposure amounts may satisfy A>C>B, and B may be nearly 0.

The exposure amount through the transflective part 310b of the mask 310 may be determined according to a characteristic of the pattern formed in the transflective part 310b.

[Table 1] illustrates the exposure characteristic according to the characteristic of the pattern formed in the transflective part 310b of the mask 310, according to exemplary embodiments of the present invention. The values described with reference to [Table 1] are exemplary, and the present invention is not limited thereto.

TABLE 1

| Mask No. | 1 | 2 | 3 | 4 |
|---|---|---|---|---|
| Line (μm) | 13 | 3 | 2.15 | 1.6 |
| Space (μm) | 1 | 0.5 | 0.4 | 0.3 |
| Open | 7.1% | 14.3% | 15.7% | 15.8% |
| Average Intensity | 0.0253 | 0.0253 | 0.0257 | 0.0249 |
| Intensity Contrast | 0.974 | 0.415 | 0.013 | 3.01E−07 |

In the pattern of the transflective part 310b of the mask 310, an average intensity and an intensity contrast of the light are measured for four masks having different light blocking parts (e.g., Line) and light transmission parts (e.g., Space).

An average intensity of the light of the first to fourth masks is about 0.025, which is effective to remove the convex part of the first organic layer 230'. That is, the convex part may be effectively removed from the first organic layer 230' with the exposure amount of about 2.5% relative to the exposure amount through the transmission part 310c of the mask 310. When the first organic layer 230' is exposed by the first and second masks, the convex part may be removed from the first organic layer 230', and the corresponding part may have protrusions and depressions. In contrast, the intensity contrast of the light of the third and fourth masks is smaller than or equal to about 0.1, and protrusions and depressions may not be generated, or may be minimally generated, in a portion where the convex part is removed from the first organic layer 230'.

Accordingly, in exemplary embodiments, the transflective part 310b of the mask 310 that removes the convex part from the first organic layer 230' may be manufactured such that the average intensity of the light is about 0.025, and the intensity contrast of the light is smaller than or equal to about 0.1.

As described above, according to exemplary embodiments of the present invention, the step between the area of the data line 171 where the light blocking member 220 is formed and the transmission area where the light blocking member 220 is not formed may be eliminated or reduced. Further, the step in the area corresponding to the thin film transistor Qa may also be eliminated or reduced. As a result, non-uniformity of the liquid crystal layer may be decreased, and thus, viewing characteristics of a liquid crystal display may be improved (e.g., the occurrence of mura may be prevented or reduced).

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A method of manufacturing a liquid crystal display, comprising:
    disposing a gate electrode and a light blocking member on a substrate;
    disposing a source electrode and a drain electrode on the gate electrode to form a thin film transistor;
    disposing a data line on the light blocking member;
    disposing an organic layer on the thin film transistor and the data line; and
    exposing a first convex part of the organic layer to light in a first area corresponding to the thin film transistor during an exposure process, and exposing a second convex part of the organic layer to the light in a second area corresponding to the data line during the exposure process using a mask,
    wherein the mask comprises a first transflective part aligned with the first area corresponding to the thin film transistor and a second transflective part aligned with the second area corresponding to the data line during the exposure process.

2. The method of claim 1, wherein the mask further comprises a transmission part aligned with a third area during the exposure process, wherein the third area corresponds to a contact hole that connects a pixel electrode and the drain electrode,
    wherein an exposure amount through the transmission part of the mask is different from an exposure amount through the first and second transflective parts of the mask.

3. The method of claim 2, wherein the exposure amount through the first and second transflective parts of the mask is about 2.5% of the exposure amount through the transmission part of the mask.

4. The method of claim 1, wherein an exposure amount through the first transflective part of the mask and an exposure amount through the second transflective part of the mask are different from each other.

5. The method of claim 4, wherein the exposure amount through the second transflective part of the mask is larger than the exposure amount through the first transflective part of the mask.

6. The method of claim 5, wherein the exposure amount through the first transflective part of the mask is about 0.

7. The method of claim 4, wherein the exposure amount through the first transflective part of the mask is larger than the exposure amount through the second transflective part of the mask.

8. The method of claim 7, wherein the exposure amount through the second transflective part of the mask is about 0.

9. The method of claim 1, wherein an intensity contrast of the light penetrating the first and second transflective parts of the mask is smaller than or equal to about 0.1.

10. The method of claim 1, further comprising removing the first and second convex parts of the organic layer using a developing solution.

11. The method of claim 1, wherein the organic layer comprises an interlayer insulating layer.

12. The method of claim 1, wherein the organic layer comprises a color filter.

13. The method of claim 2, wherein the mask further comprises a light blocking part aligned with a fourth area during the exposure process, wherein the fourth area corresponds to an area in which the data line, the thin film transistor, and the contact hole are not formed.

14. The method of claim 2, wherein the exposure amount through the transmission part of the mask is greater than the exposure amount through the second transflective part of the mask, and the exposure amount through the second transflective part of the mask is greater than the exposrure amount through the first transflective part of the mask.

15. A method of manufacturing a liquid crystal display, comprising:
disposing a light blocking member on a substrate;
disposing a data line on the light blocking member;
disposing an organic layer on the data line; and
exposing a convex part of the organic layer to light in a first area corresponding to the data line during an exposure process using a mask,
wherein the mask comprises a transflective part aligned with the first area corresponding to the data line during the exposure process.

16. The method of claim 15, wherein the mask further comprises a transmission part aligned with a second area during the exposure process, wherein the second area corresponds to a contact hole that connects a pixel electrode and a drain electrode of a thin film transistor,
wherein an exposure amount through the transmission part of the mask is different from an exposure amount through the transflective part of the mask.

17. The method of claim 16, wherein the mask further comprises a light blocking part aligned with a third area during the exposure process, wherein the third area corresponds to an area in which the data line, the thin film transistor, and the contact hole are not formed.

18. A method of manufacturing a liquid crystal display, comprising:
disposing a gate electrode on a substrate;
disposing a source electrode and a drain electrode on the gate electrode to form a thin film transistor;
disposing an organic layer on the thin film transistor; and
exposing a convex part of the organic layer to light in a first area corresponding to the thin film transistor during an exposure process using the mask,
wherein the mask comprises a transflective part aligned with the first area corresponding to the thin film transistor during the exposure process.

19. The method of claim 18, wherein the mask further comprises a transmission part aligned with a second area during the exposure process, wherein the second area corresponds to a contact hole that connects a pixel electrode and the drain electrode of the thin film transistor,
wherein an exposure amount through the transmission part of the mask is different from an exposure amount through the transflective part of the mask.

20. The method of claim 19, wherein the mask further comprises a light blocking part aligned with a third area during the exposure process, wherein the third area corresponds to an area in which the thin film transistor and the contact hole are not formed.

* * * * *